United States Patent
Ross et al.

(10) Patent No.: US 7,916,605 B2
(45) Date of Patent: Mar. 29, 2011

(54) JOINT DC MINIMIZATION AND BIT DETECTION

(75) Inventors: John Anderson Fergus Ross, Niskayuna, NY (US); Aria Pezeshk, State College, PA (US)

(73) Assignee: General Electric Company, Niskayuna, NY (US)

( * ) Notice: Subject to any disclaimer, the term of this patent is extended or adjusted under 35 U.S.C. 154(b) by 185 days.

(21) Appl. No.: 12/414,310

(22) Filed: Mar. 30, 2009

(65) Prior Publication Data

US 2010/0246359 A1 Sep. 30, 2010

(51) Int. Cl.
*G11B 5/09* (2006.01)

(52) U.S. Cl. .............. 369/59.23; 369/59.22; 369/59.1; 369/47.1; 369/47.32

(58) Field of Classification Search .................. None
See application file for complete search history.

(56) References Cited

U.S. PATENT DOCUMENTS

| | | | |
|---|---|---|---|
| 6,891,483 B2 | 5/2005 | Noda et al. | |
| 7,336,207 B2 | 2/2008 | Nakagawa | |
| 7,388,525 B2 | 6/2008 | Miyauchi et al. | |
| 7,403,138 B2 | 7/2008 | Coene | |
| 7,719,938 B2 * | 5/2010 | Kurose | 369/47.53 |
| 7,793,195 B1 * | 9/2010 | Wu | 714/781 |
| 2008/0122667 A1 | 5/2008 | Bentvelsen et al. | |

FOREIGN PATENT DOCUMENTS

| | | |
|---|---|---|
| WO | WO2007072277 | 6/2007 |
| WO | WO2008078234 | 3/2008 |

OTHER PUBLICATIONS

Bahl et al.; Optimal Decoding of Linear Codes for Minimizing Symbol Error Rate; IEEE Transactions on Information Theory, Mar. 1974; pp. 284-287.
Miyauchi et al.; Soft-Output Decoding of 17 Parity Preserve/Prohibit Repeated Minimum Transition Runlength (PP) Code; Japanese Journal of Applied Physics; vol. 43, No. 7B, 2004, pp. 4882-4883.
Miyauchi et al.; Application of Turbo Codes to High-Density Optical Disc Storage Using 17PP Code; Japanese Journal of Applied Physics; vol. 44, No. 5B, 2005, pp. 3471-3473.
Application of John Anderson Fergus Ross et al.; entitled "Bit Probability Estimation Method for Noisy Modulation Code"; filed Mar. 30, 2009.
Application of Aria Pezeshk et al.; entitled "Method for Decoding Under Optical and Electronic Noise"; filed Mar. 30, 2009.

* cited by examiner

Primary Examiner — Muhammad N Edun
(74) Attorney, Agent, or Firm — Joseph J. Christian

(57) ABSTRACT

The present techniques provide systems and methods for decoding a data signal with a control bit to improve bit estimation. The techniques in one embodiment involve using decoding algorithms to estimate the a posteriori state probabilities and the a posteriori transition probabilities of the data encoding, and estimating bit state probabilities. The techniques further involve using a control bit in the bit stream and comparing the estimation of the control bit state in the segment of the bit stream with a test control bit determined based on an average of bit states from the encoded segment of the bit stream. If the estimation of the control bit and the test control bit are not equal, the state of the bit estimate with the lowest confidence probability will be changed.

20 Claims, 9 Drawing Sheets

JOINT DC MINIMIZATION AND BIT DETECTION

BACKGROUND OF THE INVENTION

The present techniques relate generally to bit-wise optical data storage techniques. More specifically, the techniques relate to methods and systems for decoding data from optical storage systems.

As computing power has advanced, computing technology has entered new application areas, such as consumer video, data archiving, document storage, imaging, and movie production, among others. These applications have provided a continuing push to develop data storage techniques that have increased storage capacity. Further, increases in storage capacity have both enabled and promoted the development of technologies that have gone far beyond the initial expectations of the developers, such as gaming, among others.

The progressively higher storage capacities for optical storage systems provide a good example of the developments in data storage technologies. The compact disc (CD) format, developed in the early 1980s, has a capacity of around 650-700 MB of data, or around 74-80 min. of a two channel audio program. In comparison, the digital versatile disc (DVD) format, developed in the early 1990s, has a capacity of around 4.7 GB (single layer) or 8.5 GB (dual layer). The higher storage capacity of the DVD is sufficient to store full-length feature films at older video resolutions (for example, PAL at about 720 (h)×576 (v) pixels, or NTSC at about 720 (h)×480 (v) pixels).

However, as higher resolution video formats, such as high-definition television (HDTV) (at about 1920 (h)×1080 (v) pixels for 1080p), have become popular, storage formats capable of holding full-length feature films recorded at these resolutions have become desirable. This has prompted the development of high-capacity recording formats, such as the Blu-ray Disc® format, which is capable of holding about 25 GB in a single-layer disc, or 50 GB in a dual-layer disc. As resolution of video displays, and other technologies, continue to develop, storage media with ever-higher capacities will become more important.

One developing storage technology that may better achieve future capacity requirements in the storage industry is based on holographic storage. Holographic storage is the storage of data in the form of holograms, which are images of three dimensional interference patterns created by the intersection of two beams of light in a photosensitive storage medium. In bit-wise holography or micro-holographic data storage, every bit may be written as a micro-hologram, or Bragg reflection grating, typically generated by two counter-propagating focused recording beams. The writing process may also involve encoding the data. For example, error correcting codes or modulation codes may be used to encode the data as it is stored in an optical disc. The data is then retrieved by using a read beam to reflect off the micro-hologram to reconstruct the recording beam, and typically involves decoding the data to retrieve the information originally stored.

It may be desirable in many data storage systems involving the optical storage of data on optically readable mediums, to reduce the short-term direct current (DC) content of the signal. The advantages for reducing DC content may be covered in J. Bergman's Digital Baseband Transmission and Recording (1996). The DC content in a transmitted or recorded signal may be reduced by placing DC control bits at intervals throughout the encoded data stream, and may then be removed during the decoding of the data stream.

BRIEF DESCRIPTION OF THE INVENTION

A contemplated embodiment of the present techniques provides a method of decoding encoded data. The method includes estimating the state of a bit, which may be one bit or a plurality of bits, based on the encoded data, to generate a bit stream. The bit stream is an estimation of the original source information that was encoded and an estimation of one or more control bits. The method also includes encoding the estimation of source information with a test control bit to produce re-encoded data and computing an average bit state of the re-encoded data to determine a state of the test control bit. The method further includes comparing the state of the estimation of the control bit with the state of the test control bit and changing the state of the lowest confidence bit estimate in the bit stream when the state of the estimation of the control bit does not equal the state of the test control bit.

Another contemplated embodiment provides a system for decoding encoded optical data. The system includes a detector configured to detect optical returns from an optical data disc and a decoder configured to estimate source information from the optical returns, which include source information with at least one control bit. The system also includes a memory register or buffer, which may include instructions to provide an estimate of the source information from the optical returns, instructions to detect errors in the estimate of the source information, wherein the errors are obtained by comparing an estimate of the control bit to a test control bit, and instructions to correct an error in the estimate of the source information when errors are detected.

Yet another contemplated embodiment provides a decoder for decoding encoded data received in an optical storage system, including a memory register or buffer. The memory register may contain instructions to compare an estimation of a control bit state with a test control bit state. The estimation of the control bit is based on an estimation of the control bit from the encoded data which is inserted during an encoding of an input stream, and the test control bit is based on an average bit state of an output stream. The memory register also contains instructions to change the state of a bit estimation in the decoded data when the estimation of the control bit does not equal the test control bit.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
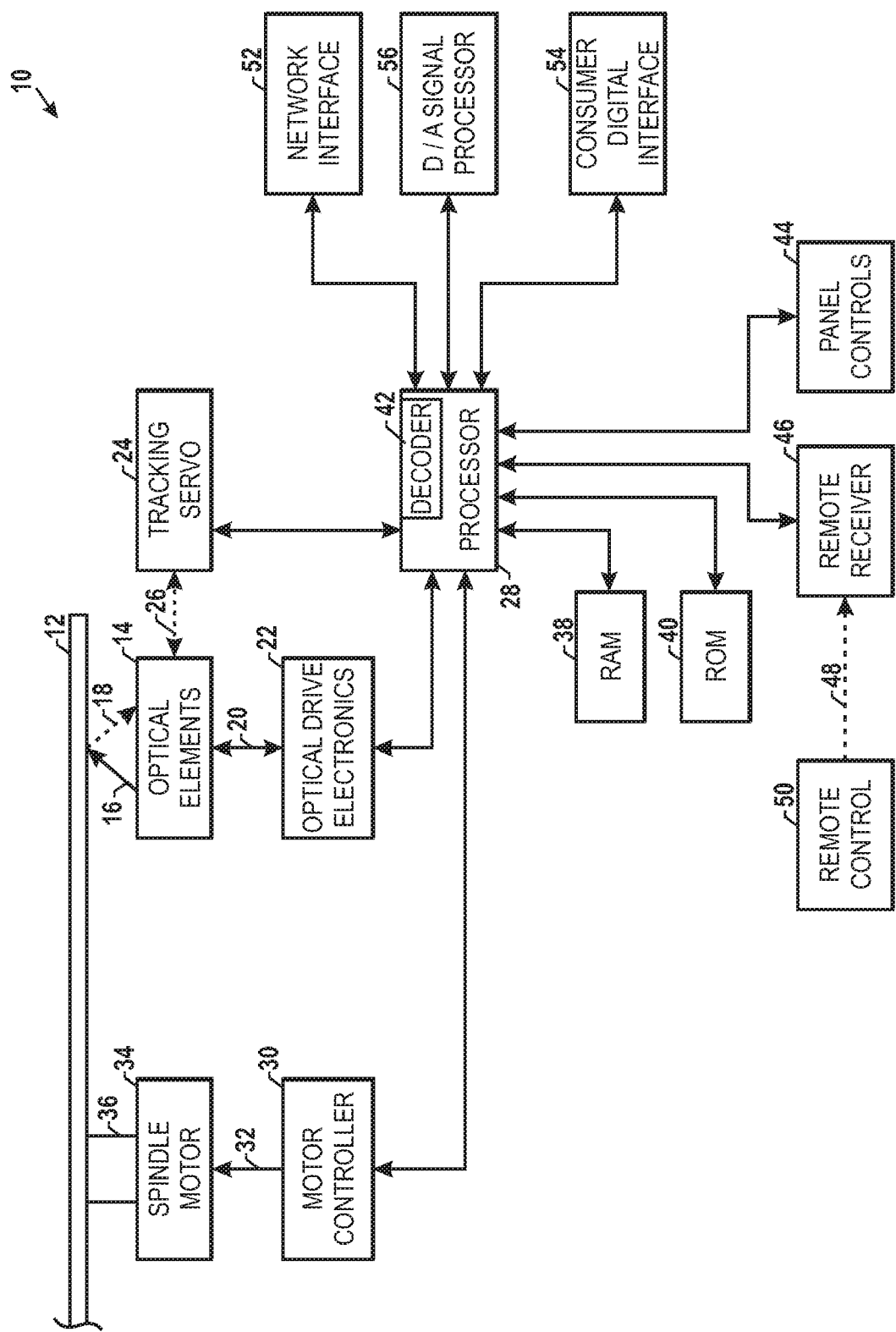
FIG. 1 is a block diagram of an optical disk reader, in accordance with embodiments of the present technique.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present techniques disclose systems and methods of detecting and correcting bit state estimations during a decoding process by using existing control bits in the data signal. Control bits may generally be inserted during an encoding process to reduce the DC content in a data signal. The present techniques may apply to storage systems such as optical or holographic storage systems. In some storage systems, data is encoded, and may be recorded before it is received at a receiver or detector. For example, in an optical storage system, digital data may be encoded and recorded on an optical data disc as optical data. The optical data may be received at a detector and decoded to retrieve the original digital source information. As control bits may have been placed in the source information during the encoding process to reduce the DC content, the decoded data signal may contain estimates of the original source information, as well as estimates of the control bits inserted during encoding. In embodiments of the present techniques, the control bit estimates may be used to detect and/or correct errors in estimations of the source information thereby serving a dual purpose. The present techniques may improve bit error rate after detection without adding additional bits by using existing control bits inserted during the encoding of the data signal.

One method of using control bits to reduce the DC content involves monitoring and controlling the running digital sum (RDS) of the modulated bits. Controlling the RDS of the modulated bits may be significant in encoding processes where the parity of the input data signal (the source information) is the same as the parity of the output data signal (the encoded signal). For example, using the 17 Parity Preserve/Prohibit (17pp) code, which is an encoding system used in Blu-ray™ storage systems, the parity of the input signal may be reflected in the output signal, allowing parity, or the RDS of the bits in the output signal to be controlled by placing control bits at certain intervals in the input signal. In embodiments of the present techniques, the parity preserving property of the 17pp code may be used to identify and correct one or more incorrect bit estimates.

Several of the terms used above may be used throughout the present disclosure, and definitions of such terms are provided to facilitate a better understanding of the present techniques. "Control bits" may refer to bits which are not user data, but bits which are inserted in a data stream during encoding to reduce the DC content. Control bits may be discarded during or after decoding an output signal. The "parity" may refer to whether the sum of bits in a "1" state in a data stream, or a segment of a data stream, is even or odd, and the running digital sum ("RDS") may refer to the average of data bits in the data stream or segment of the data stream. For example, the bit states in a data stream may be averaged, and may be somewhere between 0 and 1. Controlling the RDS by biasing the RDS towards 0.5 may reduce the DC content of the data stream. The "parity preserve" term of 17 Parity Preserve/Prohibit may refer to the characteristic that parity of the output sequence matches the parity of the input sequence.

While the error detection and/or correction of bit estimation discussed herein may apply to any optical signals, embodiments in this disclosure may use optical storage systems, and more particularly, holographic storage systems, as an example to explain the present techniques. In decoding data, the present techniques may apply to any parity preserving code system that uses DC control bits at the input, and is not limited to data encoded by the 17pp encoder given as an example in this disclosure. Further, while certain algorithms and trellis relationships may be used as examples for decoders used in accordance with the present techniques, any decoding algorithm or trellis representation may apply in the decoding techniques of the present disclosure.

An optical reader system 10, which is an example of an optical system to which the present techniques apply, may be used to read data from optical storage discs 12 is depicted in FIG. 1. The data stored on the optical data disc 12 is read by a series of optical elements 14, which project a read beam 16 onto the optical data disc 12. A reflected beam 18 is picked up from the optical data disc 12 by the optical elements 14. The optical elements 14 may comprise any number of different elements designed to generate excitation beams, focus those beams on the optical data disc 12, and detect the reflection 18 coming back from the optical data disc 12. The optical elements 14 are controlled through a coupling 20 to an optical drive electronics package 22. The optical drive electronics package 22 may include such units as power supplies for one or more laser systems, detection electronics to detect an electronic signal from the detector, analog-to-digital converters to convert the detected signal into a digital signal, and other units such as a bit predictor to predict when the detector signal is actually registering a bit value stored on the optical data disc 12.

The location of the optical elements 14 over the optical data disc 12 is controlled by a tracking servo 24 which has a mechanical actuator 26 configured to move the optical elements back and forth over the surface of the optical data disc 12. The optical drive electronics 22 and the tracking servo 24 may be controlled by a processor 28 or may be controlled by dedicated servo electronics. The processor 28 also controls a motor controller 30 which provides the power 32 to a spindle motor 34. The spindle motor 34 is coupled to a spindle 36 that controls the rotational speed of the optical data disc 12. As the optical elements 14 are moved from the outside edge of the optical data disc 12 closer to the spindle 36, the rotational speed of the optical data disc may be increased by the processor 28. This may be performed to keep the data rate of the data from the optical data disc 12 essentially the same when the optical elements 14 are at the outer edge as when the optical elements are at the inner edge. The maximum rotational speed of the disc may be about 500 revolutions per minute (rpm), 1000 rpm, 1500 rpm, 3000 rpm, 5000 rpm, 10,000 rpm, or higher.

The processor 28 is connected to some form of memory storage device such as random access memory or RAM 38 and read only memory or ROM 40. The ROM 40 typically contains the programs that allow the processor 28 to control the tracking servo 24, optical drive electronics 22, and motor controller 30. Further, the ROM 40 also contains programs that allow the processor 28 to analyze data from the optical drive electronics 22, which has been stored in the RAM 38, among others. As discussed in further detail herein, such analysis of the data stored in the RAM 38 may include, for example, demodulation, decoding or other functions necessary to convert the information from the optical data disc 12 into a data stream that may be used by other units. The demodulation and decoding, or any other analysis or conversion of data, may be performed by a decoder 42 in the processor 28 or in some other component of the optical reader system 10. Algorithms, instructions, or data used in demodulation or decoding may be stored in the RAM 38 or the ROM 40, or any other memory component accessible to the processor 28 or the decoder 42 such as a memory storage device or buffer, or any other application specific hardware.

If the optical reader system 10 is a commercial unit, such as a consumer electronic device, it may have controls to allow the processor 28 to be accessed and controlled by a user. Such controls may take the form of panel controls 44, such as keyboards, program selection switches and the like. Further, control of the processor 28 may be performed by a remote receiver 46. The remote receiver 46 may be configured to receive a control signal 48 from a remote control 50. The control signal 48 may take the form of an infrared beam, or a radio signal, among others.

After the processor 28 has analyzed the data stored in the RAM 38 to generate a data stream, the data stream may be provided by the processor 28 to other units. For example, the data may be provided as a digital data stream through a network interface 52 to external digital units, such as computers or other devices located on an external network. Alternatively, the processor 28 may provide the digital data stream to a consumer electronics digital interface 54, such as a high-definition multi-media interface (HDMI), or other high-speed interfaces, such as a USB port, among others. The processor 28 may also have other connected interface units such as a digital-to-analog signal processor 56. The digital-to-analog signal processor 56 may allow the processor 28 to provide an analog signal for output to other types of devices, such as to an analog input signal on a television or to an audio signal input to an amplification system.

While the optical reader system is described in detail according to one embodiment, there are many other features and designs of optical reader systems that are all within the scope of the optical reading system.

Figure 2:
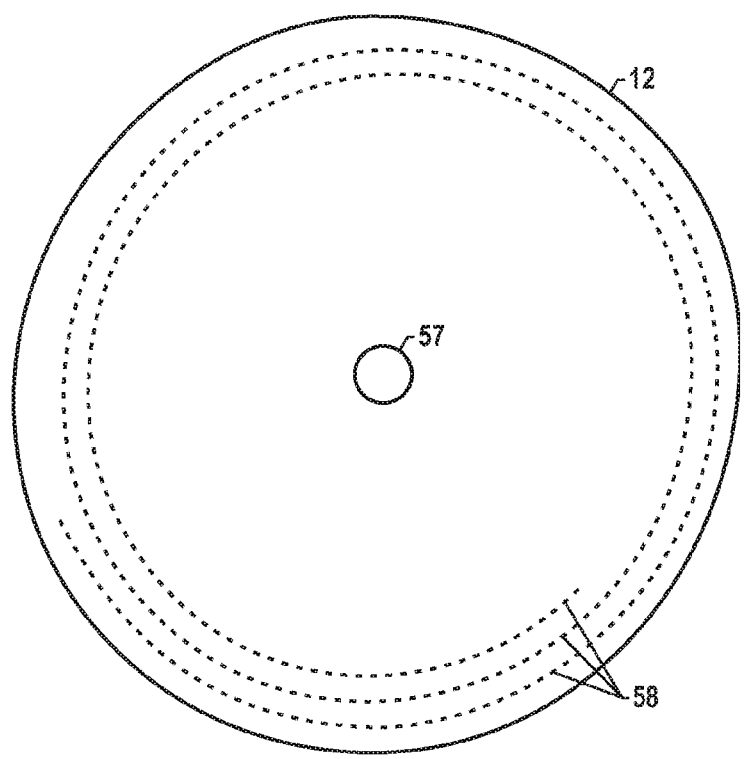
FIG. 2 illustrates an optical disk having data tracks, in accordance with embodiments of the present techniques.

The reader 10 may be used to read an optical data disc 12 containing data, as shown in FIG. 2. According to one embodiment, the optical data disc 12 is a flat, round disc with one or more data storage layers embedded in a transparent protective coating. The protective coating may be a transparent plastic, such as polycarbonate, polyacrylate, and the like. The data layers may include any number of surfaces that may reflect light, such as the micro-holograms used for bit-wise holographic data storage. The disc 12 may also include a reflective surface with pits and lands. A spindle hole 57 couples to the spindle to control the rotation speed of the disc 12. The data may be generally written in a sequential spiraling track 58 from the outer edge of the disc 12 to an inner limit, although individual concentric circular data tracks, or other configurations, may be used.

Figure 3:
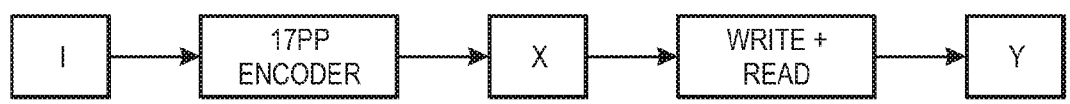
FIG. 3 is a flow chart of an overview of a method for encoding source information and writing and reading encoded output symbols, in accordance with embodiments of the present techniques.

An overview of how encoding and decoding of data may fit in an optical storage system is presented in the block diagram of FIG. 3. In storing source information, depicted as I, onto an optical storage disc 12, the source information I may first be converted into a format that may be stored on the disc 12. For example, source information I may be in the form of an electronic or digital signal, and may be encoded by a 17pp encoder to form an encoded output X, wherein X is then modulated and stored onto/into the disk. After reading, a sample set Y is detected and used to estimate the original source information I. The optical disc refers to the storage medium for the optical encoded data for which there are a number of types, variations and formats such as magneto-optical discs, compact discs (CD), laser discs, mini discs, digital versatile discs (DVD), Blu-ray Discs®, including the various holographic discs, and multilayer discs.

An optical reader system 10 may retrieve the original information I by reading the disc 12. As the original information I had been encoded for storage on the disc 12, the reader 10 may read the information as symbol outputs Y, which must be decoded and/or demodulated to retrieve the original information vector I. The symbol outputs term Y may refer to the fact that the processes of writing and reading the 17pp encoded symbols X may result in interferences and distortions from the media, optics, and the electronics of an optical storage system, such that the received output symbols Y may include noise in addition to the originally encoded symbol outputs X. Such interferences may decrease the accuracy of estimating information I from the output symbols Y, and embodiments of the present technique may effectively convert symbol outputs to retrieve original information I, while reducing errors resulting from optical and electronic noise to improve the estimation of the original source information I.

In one embodiment, the encoding, writing, and reading process may be comparable to a Markov chain, where future states of an output may depend probabilistically on a present state, and independent of past states. A recursive algorithm may be used to compute the a posteriori probabilities of the states and transitions of a Markov chain, given detected data Y. For example, such a recursive algorithm is presented by Bahl, Cocke, Jelinek, and Raviv, in the article "Optimal Decoding of Linear Codes for Minimizing Symbol Error Rate," found on pages 284-287 in the March 1974 IEEE Transactions on Information Theory, and may be referred to as the "BCJR algorithm." The Bahl-Cocke-Jelinek-Raviv (BCJR) algorithm, along with embodiments of the present techniques, will be discussed in the equations and explanations below although other recursive algorithms such as Soft Output Viterbi Algorithm (SOVA) are known in the art and within the scope of the optical reading system.

One embodiment of the present techniques involves estimating the original information I from the output symbols Y read from the optical disc 12. In some embodiments, the decoder 42 may be a maximum a posteriori (MAP) decoder, which may be used to decode the output symbols Y and estimate the original information I. In other embodiments, a decoder 42 may use other bit likelihood estimators, such as enhanced Viterbi algorithms. While the present techniques are not limited to any particular decoding scheme, one embodiment incorporates the BCJR algorithm to estimate bit probabilities. The a posteriori probabilities of the states and transitions of the encoded data X may be represented in equations (1)-(2) below:

$$Pr\{S_t = m \mid Y_1^\tau\} = Pr\{S_t = m; Y_1^\tau\}/Pr\{Y_1^\tau\} \quad \text{equation (1)}$$
$$= \lambda_t(m)/Pr\{Y_1^\tau\}$$

-continued $$Pr\{S_{t-1} = m'; S_t = m \mid Y_1^\tau\} = Pr\{S_{t-1} = m';$$
$$S_t = m; Y_1^\tau\} / Pr\{Y_1^\tau\}$$
$$= \sigma_t(m', m) / Pr\{Y_1^\tau\}$$

equation (2)

In the above equation, $Pr\{S_t=m;Y_1^\tau\}$ represents the probability that the (trellis or state representation of the) encoded data is in state m at time t, given the detected data Y, and $Pr\{S_{t-1}=m'; S_t=m; Y_1^\tau\}$ represents the probability that the encoded data transitions from state m' at time t−1 to state m at time t, given Y. The different states are denoted by m, and bits may transition from state m' to state m. The state and transition probabilities may be computed from the alpha, beta, and gamma functions, as defined by the BCJR algorithm:

$$\alpha_t(m) = Pr\{S_t=m;Y_1^t\}$$ equation (3)

$$\beta_t(m) = Pr\{Y_{t+1}^\tau \mid S_t=m\}$$ equation (4)

$$\lambda_t(m) = \alpha_t(m) \cdot \beta_t(m)$$ equation (5)

Referring back to equation (2), $\sigma_t(m',m)$ may represent the a posteriori transition probabilities of trellis states, and may be computed with the alpha, beta, and gamma functions, $$\sigma_t(m',m) = \alpha_{t-1}(m') \cdot \gamma_t(m',m) \cdot \beta_t(m),$$ equation (6)

where $$\gamma_t(m',m) = Pr\{S_t=m;Y_t \mid S_{t-1}=m'\}.$$ equation (7)

To compute the alpha, beta, and gamma functions, the following recursions may be used:

$$\alpha_t(m) = \sum_{m'} \alpha_{t-1}(m') \cdot \gamma_t(m', m)$$ equation (8)

$$\beta_t(m) = \sum_{m'} \beta_{t+1}(m') \cdot \gamma_{t+1}(m, m')$$ equation (9)

$$\gamma_t(m', m) = \sum_X p_t(m \mid m') \cdot q_t(X \mid m', m) \cdot R(Y_t, X)$$ equation (10)

In the gamma function of equation (10), $p_t(m|m')$ are the Markov transition probabilities, and $q_t(X|m',m)$ is the distribution of the output symbols. Bit probability estimates are computed using the a posteriori transition probabilities $\sigma_t(m', m)$, and the a posteriori probability estimate for a bit may be obtained by summing all of the a posteriori transition probabilities corresponding to that same input bit. For example, a bit may have a "0" state or a "1" state, and the two a posteriori estimates may be represented by $APP_t(0)$ and $APP_t(1)$:

$$APP_t(b) = Pr\{I_t = b \mid Y_1^\tau\}$$ equation (11)
$$= \sum_{X_b} \sigma_t(m', m)$$

If the probability of a bit having a 0 state, or $APP_t(0)$, is higher than the probability of a bit having a 1 state, $APP_t(1)$, then the decoder 42 may estimate that the bit b has a 0 state rather than a 1 state. The summation in equation (11) occurs over all $\sigma_t(m', m)$ values where the input bit $I_t$ corresponding to the transition (m',m) is b, and $\lfloor X_b \rfloor$ is the corresponding output of the Markov source for the transition (m',m). In some embodiments, a branch may have multiple input and output pairs, and the summation of $\sigma_t(m',m)$ may take place over all combinations of input and output pairs for each branch. To estimate the probability of the state of a bit, all of the $\sigma_t(m',m)$ values of the bit may be summed, and the decoder 42 will determine whether the probability of the bit having a 0 state is higher than the probability of the bit having a 1 state, or vice versa.

The output of the BCJR algorithm is not the source information itself, but rather the probability or likelihood of each bit state of the source information. The output of the BCJR algorithm is therefore referred to as a soft output. Typically, this soft output is determined by the algorithm using a trellis representation indicating state transitions of the encoding process. The trellis representation of the encoding process, which may be graphically depicted as a trellis diagram, may show the input-to-output relationship of a convolutional operation and the paths of state transitions for each combination of input and output pairs. The trellis diagram may depict different paths from one state to another for each time interval of an encoding process, and a decoder may use the paths of a trellis diagram to determine the encoding process by tracing data state transitions to obtain a soft output.

A trellis representation is typically determined when an input signal is decoded using a convolutional code. However, the data inputs and symbol outputs in some modulation techniques may not have an obvious convolutional relationship. A modulation code such as 17 Parity Preserve/Prohibit (17pp), for example, may enable source data to be modulated as a bit stream, such that at each step of the encoding, a variable number of data bits may be modulated. However, since the input-to-output relationship of the 17pp modulation encoding does not have an obvious convolutional relationship, the lack of an obvious trellis representation may increase the complexity of the demodulating and/or decoding of data, as a decoding algorithm may not be able to trace a trellis diagram to determine input-to-output relationships and determine the most probable input bits originally sent in the source information. A decoding scheme using a trellis structure which duplicates the input-to-output relationship of the 17pp modulation scheme is desirable.

Figure 4:
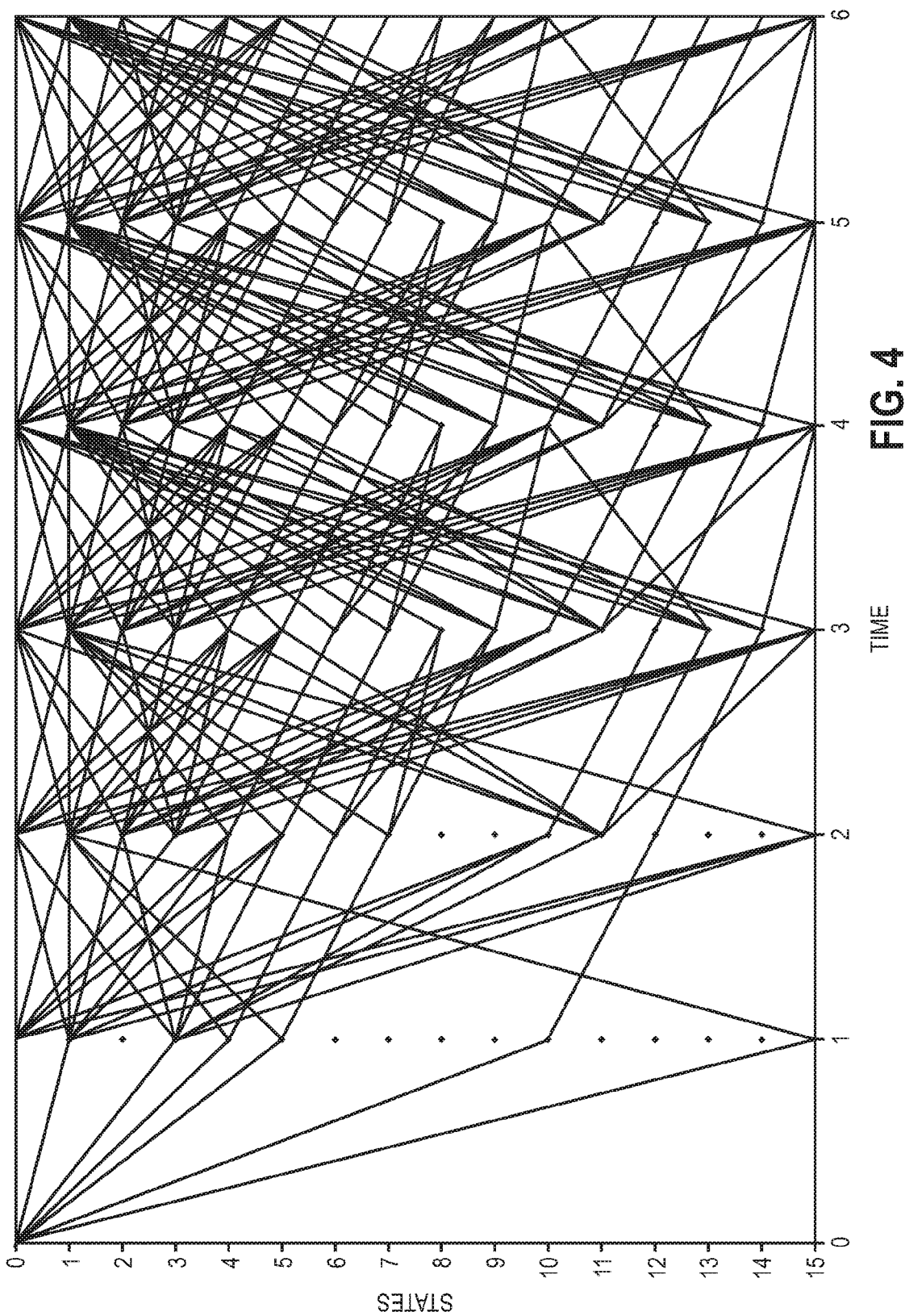
FIG. 4 is a trellis diagram having 16 states, in accordance with embodiments of the present techniques.

Some attempts at creating a trellis diagram to duplicate the 17pp scheme have resulted in a 15 state trellis diagram, as presented in Miyauchi, et al, U.S. Pat. No. 7,388,525 B2. An example of a state trellis diagram to be used in accordance with the present techniques is provided in the 16-state trellis diagram of FIG. 4. The trellis diagram may be a graphical representation of state transitions of input-to-output pairs through an encoding process, and may be used by a decoder of the present techniques to decode data modulated with the 17pp scheme.

As discussed, in encoding data in some optical systems, control bits may be inserted into segments of the input stream for purposes such as DC control. For example, this technique may be applicable for the Blu-Ray™ format. The control bit may be set to a value (e.g., 0 or 1) to reduce the DC content of the data stream. The segment of the data stream to which a parity bit is added may be referred to as a "parity segment."

Because of the parity preserving property of the 17pp code, parity of the encoded output matches the parity of the 17pp input. For example, a decoder 42 may encode with parity segments of 20 bits, meaning a control bit may be added for every 20 bits of data. Each control bit may be set to a value for the lowest DC content. In some encoding techniques, a stream of input data may be encoded, and for each parity segment, the state of the control bit may be either a 0 or a 1, depending on the RDS of the encoded segment. If the RDS of a parity segment is above 0.5, a 0 state bit may be inserted as the control bit, and if the RDS of a parity segment is below 0.5, a 1 state bit may be inserted as a control bit. In this encoding example, the DC content of the data stream may be reduced by inserting a control bit which biases the RDS closer to 0.5.

Figure 5:
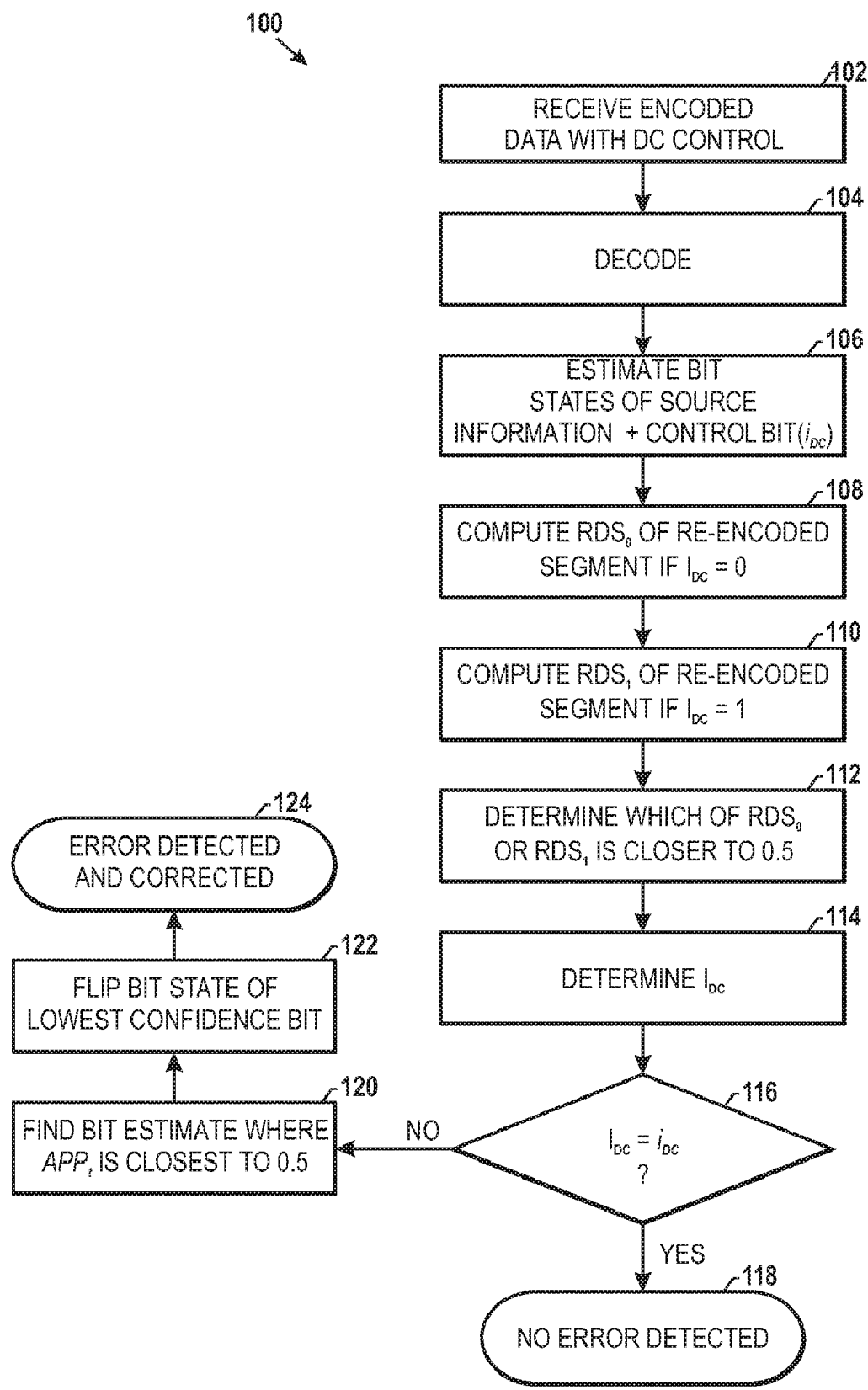
FIG. 5 is a flow chart depicting a method of detecting and correcting errors in bit state estimations using a control bit, in accordance with embodiments of the present techniques.

In embodiments of the present techniques, the control bit in each parity segment of the encoded data may be used to detect and correct bit state estimates for an improved decoding technique. FIG. 5 depicts a flow chart of a decoding process 100 using an existing control bit to detect and/or correct errors in bit estimation. The process may apply to each parity segment, or each segment of an encoded data stream having a control bit inserted during encoding (block 102). A decoder 42 may receive encoded data, including control bits (block 102). The decoder 42 may then decode the encoded data according to an algorithm similar to the previously discussed BCJR algorithm (block 104). Additionally, the decoder 42 may use a trellis relationship similar to the 16-state trellis relationship previously described.

The decoder may estimate the bit states of the source information and the bit state of one or more control bits, or $i_{DC}$ (block 106). As discussed, the estimate may be based on the probability of a bit having a 0 state or a 1 state. The decoder 42 may then re-encode the BCJR decoded stream with a test control bit set to different states. More specifically, the decoder 42 may compute the RDS of the re-encoded segment of data which contains the BCJR decoded stream and the test control bit. Two computations of the RDS may be performed, with one computation of as $RDS_0$, where the test control bit in the re-encoded segment is set to a 0 (block 108), and one computation of an $RDS_1$, where the test control bit in the re-encoded segment is set to a 1 (block 110). The decoder 42 may determine which of the $RDS_0$ or the $RDS_1$ is closer to 0.5 (block 112). In one embodiment, an RDS closest to 0.5 may have the lowest DC content. This may indicate that during the original encoding process, the control bit may have been set to a 0 or a 1 such that the parity segment may have an RDS closest to 0.5. Thus, the decoder 42 may be able to compare, the estimate of the originally inserted control bit with the test control bit which gives an RDS that is closer to 0.5 (block 114). Referring to the process 100 of FIG. 5, this test control bit may be referred to as $I_{DC}$ (blocks 108 and 110).

The decoder 42 may then determine whether $I_{DC}$ is equal to the bit state estimate $i_{DC}$ (block 116). If the two values are equal, then no error may be detected in that parity segment (block 118). If the values are not equal, then an error may have occurred due to the noise of the received signal.

If the values of $I_{DC}$ and $i_{DC}$ are not equal, then the decoder 42 may determine which bit in the data segment has the lowest confidence (block 120). Referring to equation (11), the a posteriori probability ($APP_t$) of a bit may range between 0 to 1. If the probability of the bit being in a 1 state, or the $APP_t(1)$, is closer to 0, then the bit is estimated to be in the 0 state. Conversely, if the $APP_t(1)$ is closer to 1, then the bit is estimated to be in the 1 state. Thus, a bit having an $APP_t$ closest to 0.5 may have the lowest confidence. When the values of $I_{DC}$ and $i_{DC}$ are not equal, the decoder 42 may find the bit in the data segment having an $APP_t$ closest to 0.5, and flip the state of that bit estimate (block 122). In some embodiments, the bit estimate with the lowest confidence may also be the control bit, and the state of the control bit may be corrected. Thus, in accordance with embodiments of the present techniques, errors may not only be detected, but also corrected, further improving the decoding performance of the decoder 42 (block 124).

The steps of the process 100 are an example of one embodiment of the present techniques, and are not limited to the order depicted in FIG. 5. Steps of the process 100 may be performed in a different order, or multiple steps may be performed concurrently. For example, the running digital sums $RDS_0$ and $RDS_1$ may be computed in different orders, or computed concurrently.

As an example of improving decoding performance using the present techniques, incorrect bits were detected and corrected using different lengths of parity segments. The graphs 120, 130, 140, 150, and 160 of FIGS. 6-10 are decoding simulations which show improvements between decoding performances using the present techniques 124 and decoding performance with no parity check 122. The simulations were made using 500 input bits and 3000 frames. Decoding performances were tested throughout a range of optical settings to produce a range of optical noise, measured in decibels. Different parity segment lengths of 4 bits, 20 bits, 50 bits, and 100 bits were tested. Further, different decibels of electrical noise were simulated in the different graphs 120, 130, 140, 150, and 160.

Figure 6:
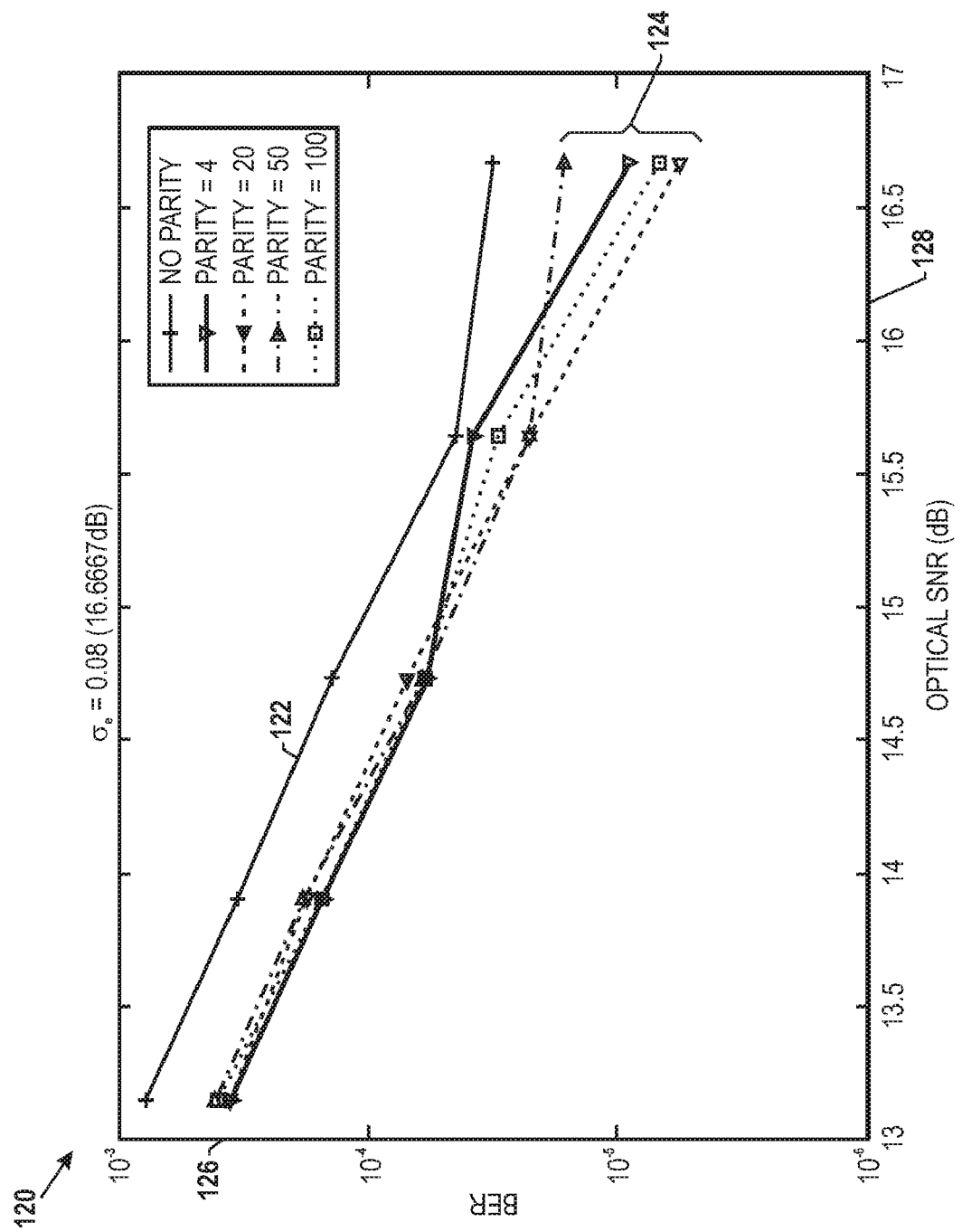
FIGS. 6-10 are graphs comparing the error rates of decoding performances with an added parity bit to various lengths of output sequences across different optical and electronic noise conditions, in accordance with embodiments of the present techniques.

Referring first to FIG. 6, the decoding performances in graph 120 are measured by the error rate 126 in the y-axis, which is taken through a range of optical settings 128 in the x-axis. The "error rate" of the graphs 120, 130, 140, 150, and 160 may refer to a best decoding performance, or a decoding performance with the lowest bit error rate for a given optical and electrical setting. The simulation which produced the graph 120 introduced electrical noise with a variance of 0.08, producing about 16.67 dB of noise. The symbol $\sigma_e$ may refer to the variance of electrical noise in the optical storage system. Different values selected for the variance of electrical noise may result in different distributions of electrical noise. Incorporating different noise distributions in the decoding algorithms may enable a decoder 42 to reduce word errors resulting from noise. The decoding performance when no parity check is used 122 may have a higher error rate throughout ranges of different optical settings 128 than the decoding performances of any length of parity segment 124.

Figure 7:
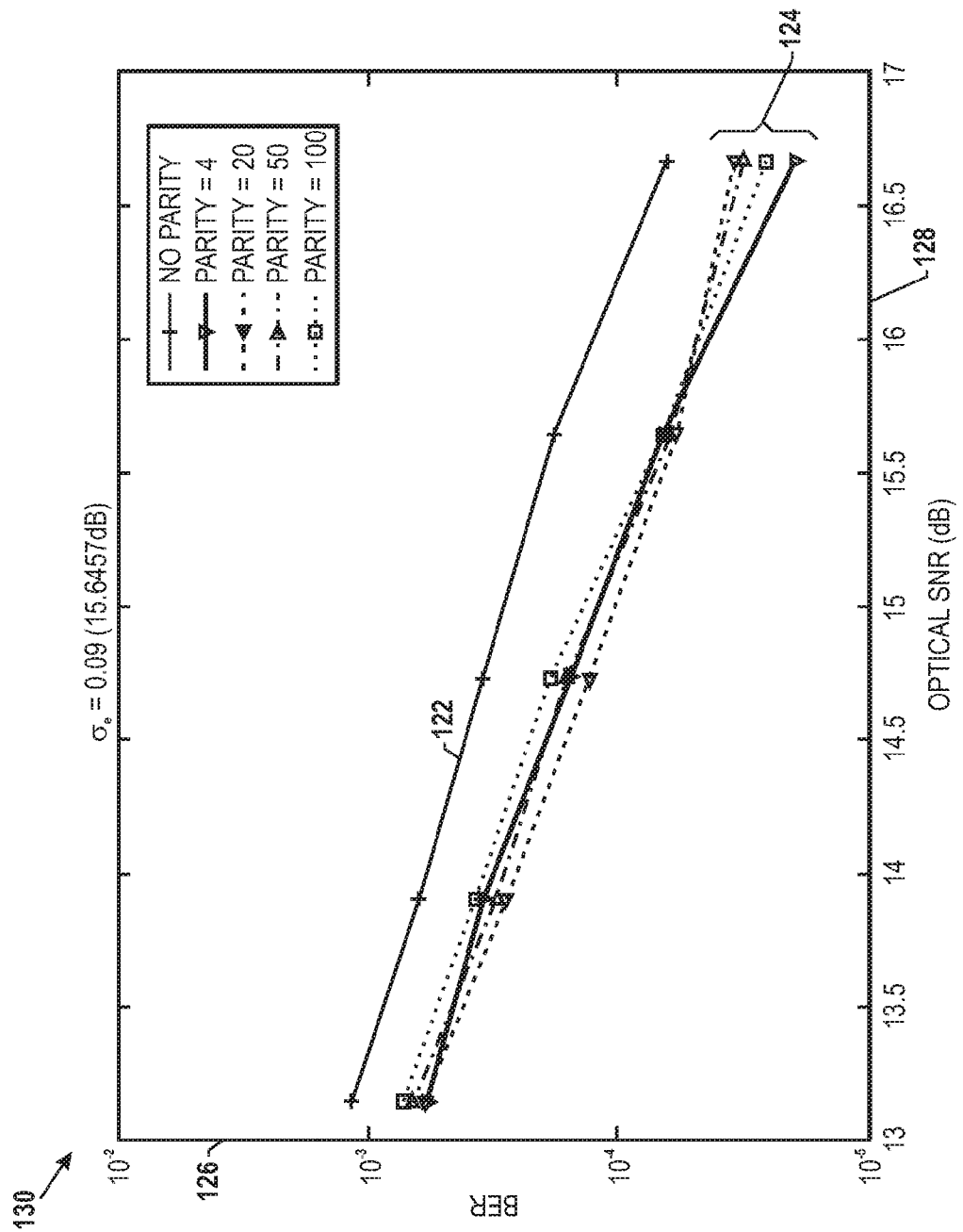
Figure 8:
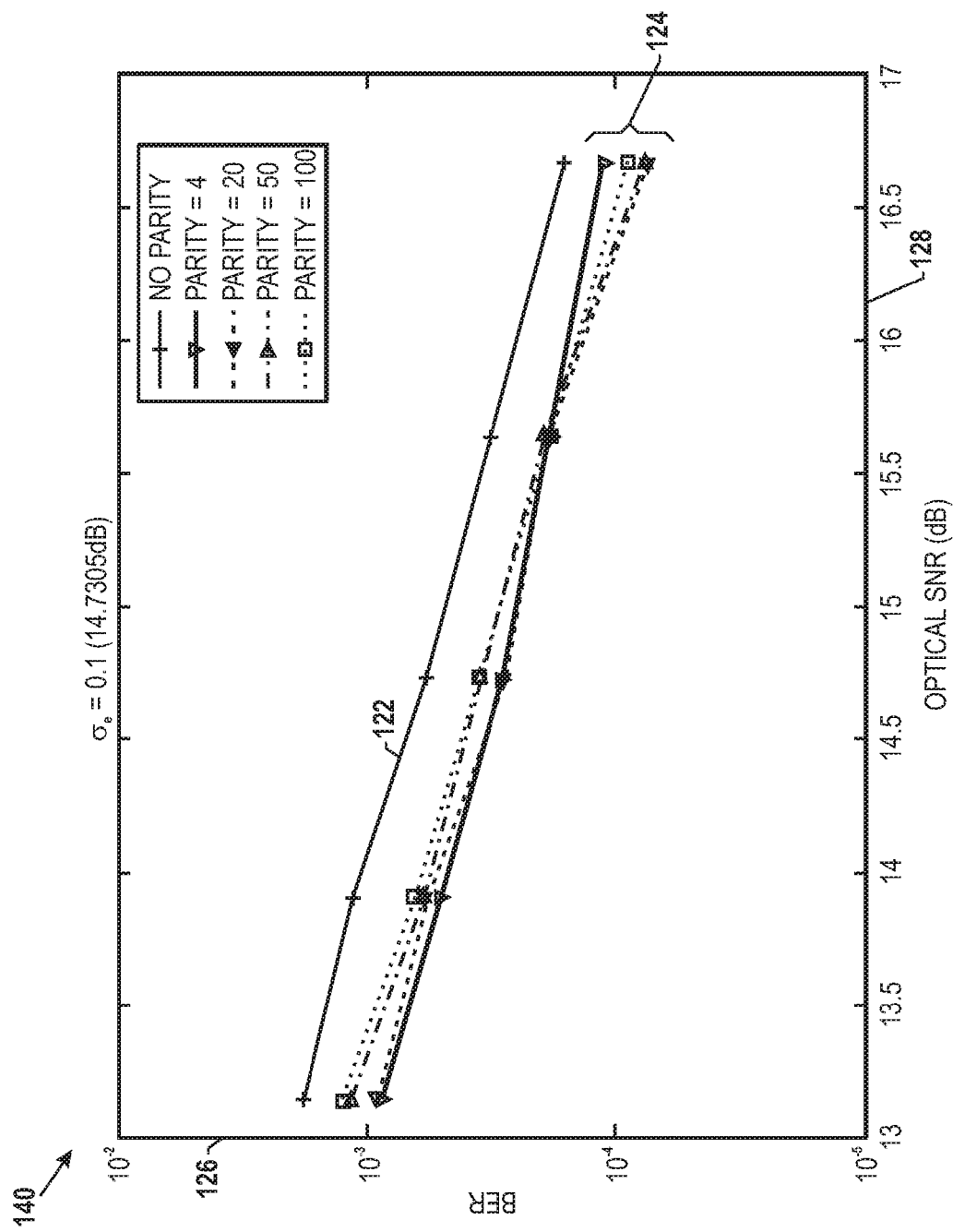
Figure 9:
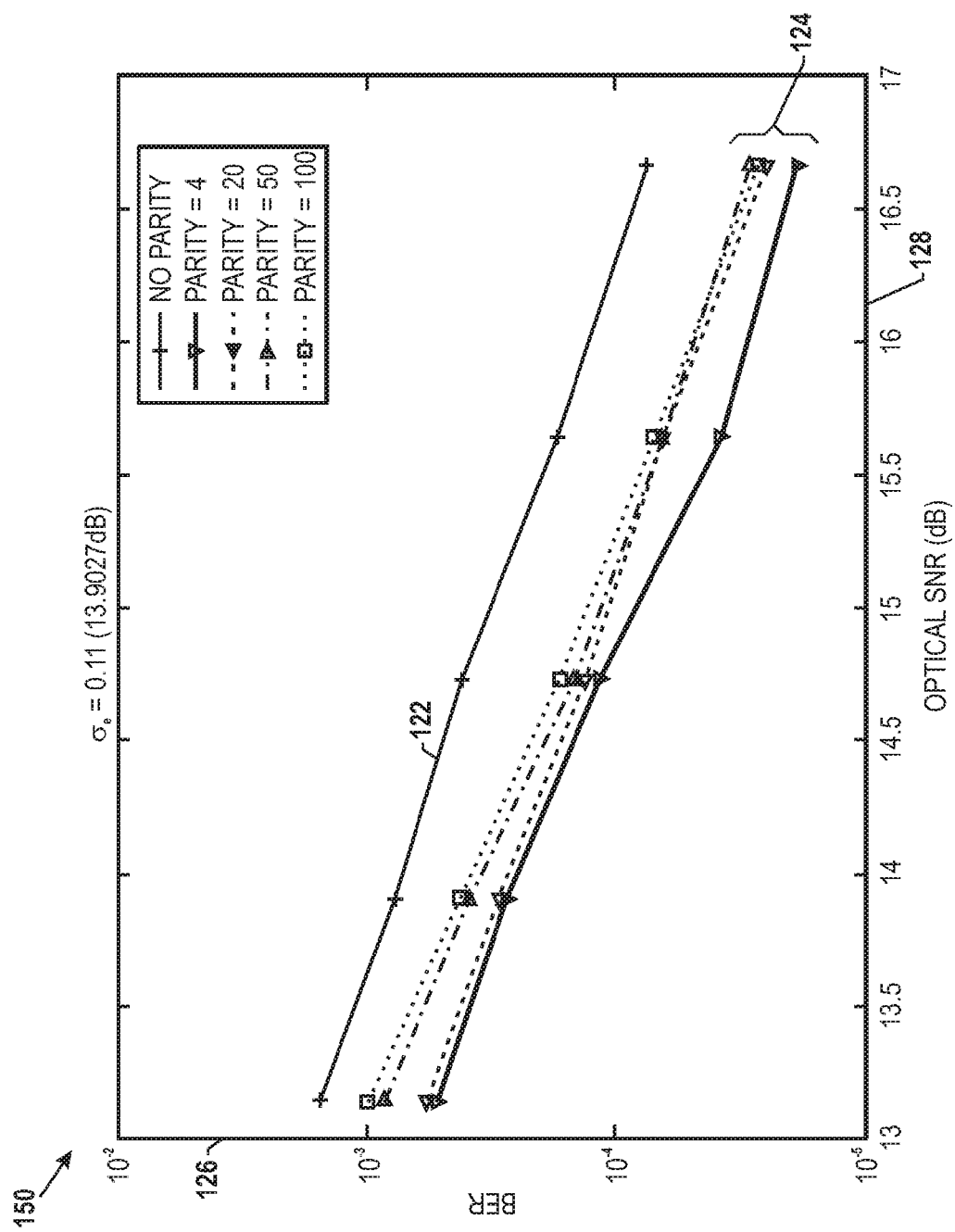
Figure 10:
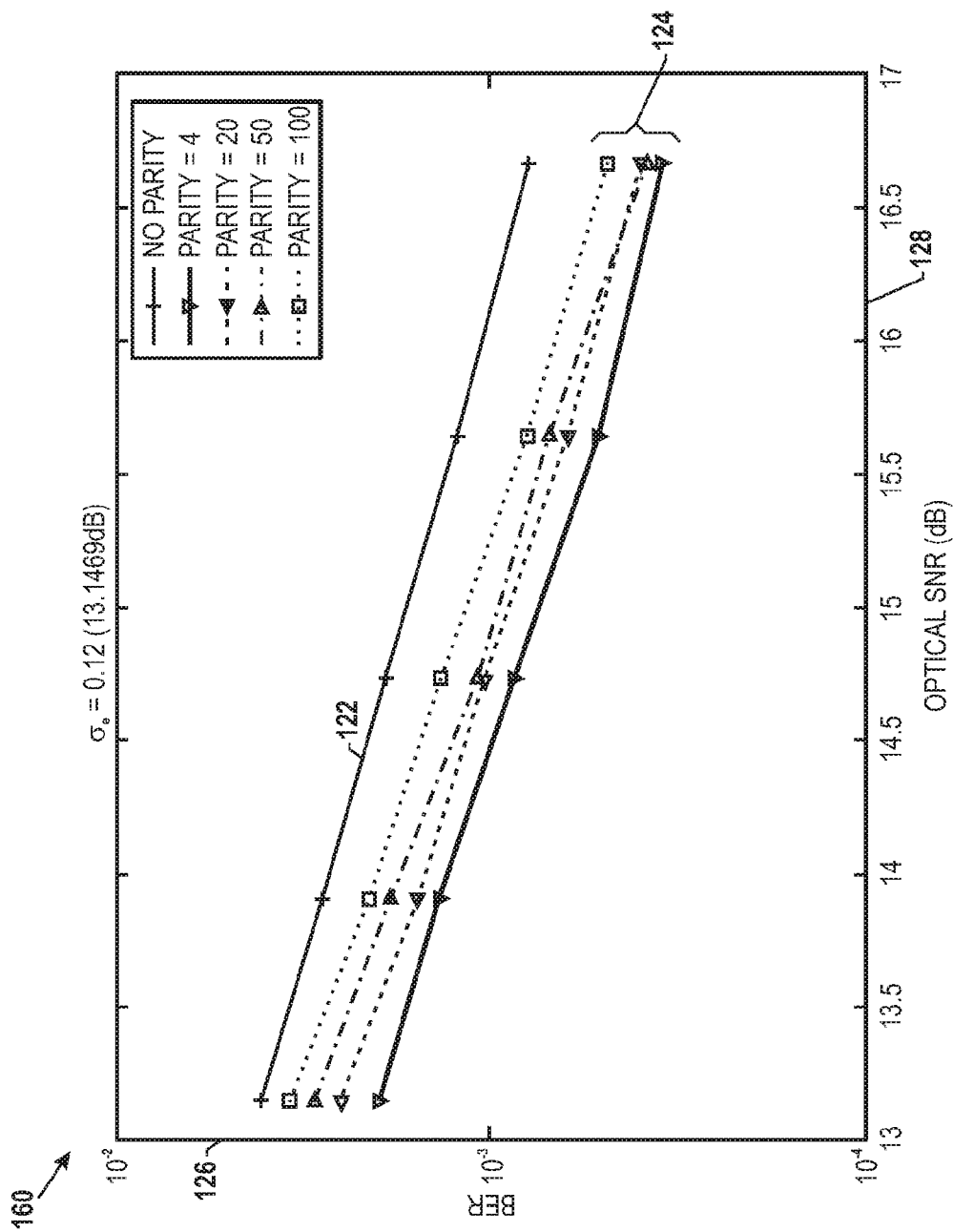

The simulations producing graphs 130, 140, 150, and 160 of FIGS. 7-10 may be performed similarly, with a change in the variance of electrical noise $\sigma_e$. The variance used to produce the graph 130 of FIG. 7 is 0.09, simulating approximately 15.65 dB of electrical noise. The variances used to produce the graphs 140, 150, and 160 are, respectively, 0.10, 0.11, and 0.12, and simulate 14.73 dB, 13.90 dB, and 13.15 dB of electrical noise. Throughout the different simulations using different inputs of electrical noise, the decoding performances incorporating the parity scheme of the present techniques have lower error rates than the decoding performance without a parity scheme. The lower error rate is consistent throughout different optical settings, or different ranges of optical noise.

Decoding performance may typically have a greater improvement when a smaller parity segment is used, as the comparison of smaller segments may enable a decoder 42 to identify an erroneous bit estimate with greater accuracy. For example, a longer parity segment may increase the chance that more than one bit estimate error exists in one parity segment. If more than one error exists, a decoder 42 may correct only the error with the lowest confidence. Further, if a segment contains two errors, or an even number of errors the parity may still be preserved, and an error may not be detected. The graphs 120, 130, 140, 150, and 160 of FIGS. 6-10 indicate some variation in decoding performances for different parity segment lengths. However, each decoding performance for a parity segment of any length has a lower error rate than the decoding performance of a decoder not using the parity scheme of the present techniques. This performance is consistent throughout various optical and electrical settings.

Though the examples used herein refer to correcting only one bit with the lowest probability confidence, embodiments of the present techniques may also correct more than one bit. Furthermore, more than one iteration of the parity scheme may be run in the decoding process, and subsequent iterations may overlap in the data signal to further enhance bit estimation error detection and correction.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for decoding encoded data, comprising:
   estimating a state of a plurality of bits based on the encoded data to generate a bit stream, wherein the bit stream comprises an estimation of the state of each of the bits of the source information and an estimation of the state of at least one control bit;
   encoding the estimation of source information with a test control bit to produce re-encoded data;
   computing an average bit state of the re-encoded data to determine a state of the test control bit;
   comparing a state of the estimation of the control bit with the state of the test control bit; and
   changing a state of a lowest confidence bit estimate in the bit stream when the state of the estimation of the control bit does not equal the state of the test control bit.

2. The method of claim 1, wherein estimating the state of the bit is based on a recursive decoding algorithm substantially similar to a BCJR algorithm or Soft Output Viterbi Algorithm.

3. The method of claim 1, wherein estimating the state of the bit is based on a modulation trellis having paths corresponding to state transitions in an encoding process of the detected data.

4. The method of claim 1, wherein the bit stream comprises a segment of the encoded data.

5. The method of claim 4, wherein the segment is a variable length.

6. The method of claim 1, wherein the test control bit is a DC control bit.

7. The method of claim 1, wherein the test control bit is determined based on a running digital sum of the re-encoded data.

8. The method of claim 1, wherein the source information and the control bit are encoded with a parity preserving modulation code.

9. The method of claim 1, wherein the source information is encoded with a 17 Parity Preserve/Prohibit (17pp) modulation code.

10. The method of claim 1, further comprising discarding the control bit from the bit stream to create a corrected bit stream.

11. The method of claim 1, further comprising outputting a corrected bit stream.

12. A system for decoding encoded optical data, comprising:
    a detector configured to detect optical returns from an optical data disc, wherein the optical returns comprise source information with at least one control bit;
    a decoder coupled to the detector and configured to estimate source information from the optical returns; and
    a memory buffer accessible to the decoder, comprising:
      instructions to provide an estimate of the source information from the optical returns;
      instructions to detect errors in the estimate of the source information, wherein the errors are obtained by comparing an estimate of the control bit to a test control bit; and
      instructions to correct the estimate of the source information when errors are detected.

13. The system of claim 12, wherein the instructions to detect errors in the estimates are based on a parity preserving scheme.

14. The system of claim 12, wherein the instructions to correct an error comprises:
    instructions for finding a bit estimate in the source information estimate having a lowest confidence; and
    instructions for switching a state of the bit estimate having the lowest confidence.

15. The system of claim 12, wherein the instructions are based on a recursive algorithm substantially similar to a BCJR algorithm or Soft Output Viterbi Algorithm (SOVA).

16. A decoder for decoding encoded data in an optical storage device to produce decoded data, wherein the decoder is coupled to a memory buffer comprising:
    instructions to compare an estimation of a control bit with a test control bit, wherein the estimation of the control bit is based on an estimation of the control bit from the encoded data which is inserted during an encoding of an input stream, and wherein the test control bit is based on an average bit state of an output stream; and
    instructions to change a state of a bit estimation in the decoded data when the estimation of the control bit does not equal the test control bit.

17. The decoder of claim 16, comprising:
    instructions to decode the data received based on a decoding algorithm substantially similar to a BCJR algorithm.

18. The decoder of claim 16, wherein the encoded data comprises segments of encoded data, each with a respective control bit inserted during the encoding of the input stream.

19. The decoder of claim 18, wherein the segments of encoded data are variable length.

20. The decoder of claim 16, wherein the instructions to change a state of the bit estimation in the decoded data comprises finding a bit estimate in the decoded data having a lowest probability confidence.

* * * * *